US 7,402,552 B2
Jul. 22, 2008

(12) United States Patent
Honda et al.

(10) Patent No.: US 7,402,552 B2
(45) Date of Patent: Jul. 22, 2008

(54) NON-CORROSIVE CLEANING COMPOSITION FOR REMOVING PLASMA ETCHING RESIDUES

(75) Inventors: Kenji Honda, Warwick, RI (US); Michelle Elderkin, Pawtucket, RI (US); Vincent Leon, Scottsdale, AZ (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 0 days.

(21) Appl. No.: 11/305,794

(22) Filed: Dec. 16, 2005

(65) Prior Publication Data

US 2006/0094614 A1    May 4, 2006

Related U.S. Application Data

(60) Division of application No. 10/143,082, filed on May 10, 2002, now Pat. No. 7,001,874, which is a continuation of application No. 09/439,469, filed on Nov. 15, 1999, now Pat. No. 6,413,923.

(51) Int. Cl.
*H01L 21/461* (2006.01)
(52) U.S. Cl. .............................. 510/175; 510/176; 134/3
(58) Field of Classification Search ................. 510/175, 510/176; 134/3
See application file for complete search history.

(56) References Cited

U.S. PATENT DOCUMENTS

| | | | |
|---|---|---|---|
| 3,582,401 A | 6/1971 | Berilla et al. | |
| 3,962,108 A | 6/1976 | Perruccio | |
| 3,962,497 A | 6/1976 | Doty et al. | |
| 3,975,215 A | 8/1976 | Rodzewich | |
| 4,015,986 A | 4/1977 | Paal et al. | |
| 4,026,831 A | 5/1977 | Moriya et al. | |
| 4,139,607 A | 2/1979 | Simons et al. | |
| 4,169,068 A | 9/1979 | Harita et al. | |
| 4,239,661 A | 12/1980 | Muraoka et al. | |
| 4,267,260 A | 5/1981 | Miura et al. | |
| 4,304,681 A | 12/1981 | Martin et al. | |
| 4,395,348 A | 7/1983 | Lee | |
| 4,395,479 A | 7/1983 | Ward et al. | |
| 4,401,747 A | 8/1983 | Ward, Jr. et al. | |
| 4,401,748 A | 8/1983 | Ward, Jr. et al. | |
| 4,403,029 A | 9/1983 | Ward, Jr. et al. | |
| 4,428,871 A | 1/1984 | Ward et al. | |
| 4,509,989 A | 4/1985 | Sumansky | |
| 4,612,049 A | 9/1986 | Berner et al. | |
| 4,617,251 A | 10/1986 | Sizensky | |
| 4,659,512 A | 4/1987 | Macedo et al. | |
| 4,680,133 A | 7/1987 | Ward | |
| 4,770,713 A | 9/1988 | Ward | |
| 4,775,449 A | 10/1988 | Dumas et al. | |
| 4,778,669 A | 10/1988 | Fuchs et al. | |
| 4,786,578 A | 11/1988 | Neisius et al. | |
| 4,791,043 A | 12/1988 | Thomas et al. | |
| 4,824,762 A | 4/1989 | Kbayashi et al. | |
| 4,824,763 A | 4/1989 | Lee | |
| 4,830,772 A | 5/1989 | Van De Mark | |
| 4,834,912 A | 5/1989 | Hodgens, II et al. | |
| 4,844,832 A | 7/1989 | Kobayashi et al. | |
| 4,904,571 A | 2/1990 | Miyashita et al. | |
| 4,944,893 A | 7/1990 | Tanaka et al. | |
| 4,971,715 A | 11/1990 | Armant et al. | |
| 4,992,108 A | 2/1991 | Ward et al. | |
| 5,091,103 A | 2/1992 | Dean et al. | |
| 5,102,777 A | 4/1992 | Lin et al. | |
| 5,114,834 A | 5/1992 | Nachshon | |
| 5,132,038 A | 7/1992 | Kukanskis et al. | |
| 5,139,607 A | 8/1992 | Ward et al. | |
| 5,145,717 A | 9/1992 | Drury | |
| 5,174,816 A | 12/1992 | Aoyama et al. | |
| 5,185,235 A | 2/1993 | Sato et al. | |
| 5,209,858 A | 5/1993 | Heinsohn et al. | |
| 5,234,506 A | 8/1993 | Winston et al. | |
| 5,279,771 A | 1/1994 | Lee | |
| 5,296,041 A | 3/1994 | Vinci et al. | |
| 5,308,745 A | 5/1994 | Schwartzkopf | |
| 5,312,562 A | 5/1994 | Vinci et al. | |
| 5,318,640 A | 6/1994 | Ishii et al. | |
| 5,334,332 A | 8/1994 | Lee | |
| 5,381,807 A | 1/1995 | Lee | |
| 5,417,802 A | 5/1995 | Obeng | |
| 5,419,779 A | 5/1995 | Ward | |
| 5,447,575 A | 9/1995 | Crump et al. | |
| 5,472,830 A | 12/1995 | Honda | |
| 5,480,585 A | 1/1996 | Shiotsu et al. | |
| 5,482,566 A | 1/1996 | Lee | |
| 5,484,518 A | 1/1996 | Goldberg | |

(Continued)

FOREIGN PATENT DOCUMENTS

DE    3821231    1/1989

(Continued)

OTHER PUBLICATIONS

Hawley's Condensed Chemical Dictionary, p. 249, Richard J. Lewis, Van Nostrand Reinhold Company, New York, NY 1993.

*Primary Examiner*—Gregory E Webb
(74) *Attorney, Agent, or Firm*—Fish & Richardson P.C.

(57) ABSTRACT

A non-corrosive cleaning composition for removing residues from a substrate. The composition comprises: (a) water; (b) at least one hydroxylammonium compound; (c) at least one basic compound, preferably selected from the group consisting of amines and quaternary ammonium hydroxides; (d) at least one organic carboxylic acid; and (e) optionally, a polyhydric compound. The pH of the composition is preferably between about 2 to about 6.

11 Claims, No Drawings

U.S. PATENT DOCUMENTS

| | | | |
|---|---|---|---|
| 5,496,491 | A | 3/1996 | Ward et al. |
| 5,507,978 | A | 4/1996 | Honda |
| 5,543,353 | A | 8/1996 | Suzuki et al. |
| 5,612,304 | A | 3/1997 | Honda et al. |
| 5,630,904 | A | 5/1997 | Aoyama et al. |
| 5,648,324 | A | 7/1997 | Honda et al. |
| 5,698,503 | A | 12/1997 | Ward et al. |
| 5,702,631 | A | 12/1997 | Conville et al. |
| 5,739,168 | A | 4/1998 | Hioki et al. |
| 5,780,406 | A * | 7/1998 | Honda et al. ............... 510/175 |
| 6,030,932 | A | 2/2000 | Leon et al. |
| 6,033,993 | A * | 3/2000 | Love et al. ................. 438/745 |
| 6,245,155 | B1 * | 6/2001 | Leon et al. ..................... 134/3 |
| 6,361,712 | B1 * | 3/2002 | Honda et al. ............... 252/79.3 |
| 2001/0032829 | A1 * | 10/2001 | Honda et al. ................ 216/108 |

FOREIGN PATENT DOCUMENTS

| | | |
|---|---|---|
| DE | 3828513 | 3/1990 |
| EP | 0414097 | 2/1991 |
| EP | 0 485 161 | 5/1992 |
| EP | 0511163 | 10/1992 |
| EP | 0647884 | 4/1995 |
| JP | 4924123 | 3/1974 |
| JP | 56115368 | 9/1981 |
| JP | 6350838 | 3/1988 |
| JP | 63208043 | 8/1988 |
| JP | 6442653 | 2/1989 |
| JP | 6481949 | 3/1989 |
| JP | 6481950 | 3/1989 |
| JP | 6488548 | 4/1989 |
| JP | 1114846 | 5/1989 |
| JP | 1133049 | 5/1989 |
| JP | 248668 | 2/1990 |
| JP | 2131239 | 5/1990 |
| JP | 2253265 | 10/1990 |
| JP | 4124668 | 4/1992 |
| JP | 4350660 | 12/1992 |
| JP | 545894 | 2/1993 |
| JP | 728254 | 1/1995 |
| JP | 7244386 | 9/1995 |
| JP | 7271056 | 10/1995 |
| WO | WO 94/08276 | 4/1994 |
| WO | WO 88/05813 | 8/1998 |

* cited by examiner

NON-CORROSIVE CLEANING COMPOSITION FOR REMOVING PLASMA ETCHING RESIDUES

CROSS-REFERENCE TO RELATED APPLICATIONS

The present application is a divisional of patent application Ser. No. 10/143,082 filed on May 10, 2002 now U.S. Pat. No. 7,001,874, which is a continuation of patent application Ser. No. 09/439,469 filed on Nov. 15, 1999 now U.S. Pat. No. 6,413,923, the content of which is hereby incorporated herein by reference.

FIELD OF THE INVENTION

This invention relates to a novel cleaning composition for use in microelectronics manufacturing, and more particularly to a non-corrosive cleaning composition for removing plasma etch residues formed on wafer substrates after plasma etching of metal layers or oxide layers deposited on the substrates.

BACKGROUND OF THE INVENTION

In the manufacture of microcircuits, positive photoresists are used as an intermediate mask for transferring an original mask pattern of a reticule onto wafer substrates by means of a series of photolithography and plasma etching steps. One of the final steps in the microcircuit manufacturing process is the removal of the patterned photoresist films from the substrates. In general, this step is affected by one of two methods. One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet stripping methods are sometimes ineffective for removing inorganic residual materials formed during the plasma etching of metal or oxide layers with halogen-containing gases.

An alternative method of removing a photoresist film involves exposing a photoresist-coated wafer to oxygen-based plasma in order to burn the resist film from the substrate surface in a process known as plasma ashing. Plasma ashing has become more popular in the microcircuit manufacturing process because it is carried out in a vacuum chamber and, hence, is expected to be less susceptible to airborne particulate or metallic contamination. However, plasma ashing is also not fully effective in removing the plasma etching by-products noted above. Instead, removal of these plasma etching by-products must be accomplished by subsequently exposing the photoresist film to certain cleaning solutions. Several commercial products are now available to clean the plasma etching by-products left by plasma etching followed by plasma ashing. For example, EKC 265, available from EKC Technology, Inc., is a post etching cleaning solution composed of water, alkanolamine, catechol and hydroxylamine. Such a composition is disclosed in U.S. Pat. No. 5,279,771 to Lee. ACT 935, available from Ashland Chemical, is another post etching cleaning solution and is composed of water, alkanolamine and hydroxylamine. Such a composition is disclosed in U.S. Pat. No. 5,419,779 to Ward. In both cases, hydroxylamine is used as a corrosion inhibitor. ELM C-30, available from Mitsubishi Gas Chemical, is composed of water, N,N-dimethylformamide, a fluorine compound, organic carboxylate, and a sugar alcohol, wherein the sugar alcohol acts as a corrosion inhibitor. Such a composition is disclosed in U.S. Pat. No. 5,630,904 to Aoyama et al.

These commercial products can effectively dissolve plasma etching residues, however, they can also attack the metallic and oxide layers deposited patternwise on the substrate. This is because the pH of EKC 265 and ACT 935 is above 11 and ELM C-30 contains a fluorine compound. The corrosion inhibitors used in these products are not completely effective in stopping corrosion, because metal layers such as copper, aluminum or aluminum alloys (e.g., Al—Cu—Si), and the like are particularly corrosion sensitive. Furthermore, while the addition of a suitable corrosion inhibitor is essential to prevent corrosion of the substrate metal layers, some corrosion inhibitors tend to inhibit the removal of the plasma etching residue and/or form an insoluble film deposited on the metal substrate surface. Therefore, the corrosion inhibitor must be carefully selected.

It is also difficult to balance effective plasma etching residue removal over corrosion inhibition because chemical compositions of the plasma etching residues are generally similar to those of the metal layers or oxide layers on the substrate. The alkanolamines used in prior art cleaning compositions were oftentimes found to attack the plasma etching residue and the substrate metal layers in the presence of water. Accordingly, there remains a need for a composition that can selectively and effectively remove plasma etching residues without the unwanted attack on the metallic and oxide layers, which causes a loss of metal layers.

Several other patents in the photoresist stripper/cleaner application field exist as follows, although none of them disclose the use of the compositions of the present invention:

Japanese Patent Application No. 7-028254, assigned to Kanto Kagaku, discloses a non-corrosive resist removal liquid comprising a sugar alcohol, an alcohol amine, water, and a quaternary ammonium hydroxide.

PCT Published Patent Application No. WO 88-05813 teaches a positive or negative photoresist stripper containing butyrolactone or caprolactone, quaternary ammonium hydroxide compound, and optionally, a nonionic surfactant.

U.S. Pat. No. 4,239,661 to Muraoka et al. discloses a surface-treating agent comprising an aqueous solution of 0.01% to 20% trialkyl (hydroxyalkyl) ammonium hydroxide. This agent is useful in removing organic and inorganic contaminants deposited on the surface of intermediate semiconductor products.

U.S. Pat. No. 4,904,571 to Miyashita et al. teaches printed circuit board photoresist stripper composition containing a solvent (e.g., water, alcohols, ethers, ketones, and the like), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing: (A) N-alkyl-2-pyrrolidone; (B) 1,2-propanediol; and (C) tetraalkylammonium hydroxide.

U.S. Pat. No. 5,139,607 to Ward et al. teaches positive and negative photoresist stripping composition containing: (A) tetrahydrofurfuryl alcohol; (B) a polyhydric alcohol (e.g., ethylene glycol or propylene glycol); (C) the reaction product of furfuryl alcohol and an alkylene oxide; (D) a water-soluble Bronstead base type hydroxide compound (e.g., alkali metal hydroxide, ammonium hydroxide and tetramethyl ammonium hydroxide); and (E) water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, which composition comprises an aqueous solution containing 0.01 to 15% by weight of a quaternary ammonium hydroxide, such as trimethyl (2-hydroxyethyl) ammonium hydroxide, and 0.1 to 20% by weight of sugar or sugar alcohol, such as xylitol, mannose, glucose and the like.

Other compositions used to strip photoresist include a solution of $H_2SO_4$ and an oxidizing agent such as $H_2O_2$ that oxidizes, and thus decomposes organic photoresists. However, solutions containing strong acids and oxidizing agents are hazardous to handle, must be applied at elevated temperatures, and require a sufficient amount of hot deionized (DI) water after stripping is performed. Also, such solutions have a short active life as the oxidizing agent readily decomposes. Thus, it is necessary to frequently replenish the solutions. The need for solution replenishment renders the process both hazardous and economically inefficient. In addition, these types of conventional acid-based chemistries are too aggressive on the metal substrates.

Therefore, there remains a need for a new type of cleaning composition for removing plasma etch residues from substrates. Additionally, there remains a need for such a cleaning composition that does not deleteriously affect the substrate. Further, there remains a need for such a cleaning composition that is aqueous-based, non-hazardous and will not harm the environment.

SUMMARY OF THE INVENTION

The present invention is directed to a non-corrosive cleaning composition that is useful primarily for removing plasma etch residues from a substrate. The composition contains (a) water; (b) at least one hydroxylammonium compound; (c) at least one basic compound, preferably selected from the group consisting of amines and quaternary ammonium hydroxides; and (d) at least one organic carboxylic acid. Optionally, a polyhydric compound may be included. The pH of the composition is between about 2 to about 6.

DETAILED DESCRIPTION OF THE INVENTION

Metal substrates are generally susceptible to corrosion. For example, substrates such as aluminum, copper, aluminum-copper alloy, tungsten nitride, and other metals and metal nitrides will readily corrode by using conventional cleaning chemistries. This is due to the high alkalinity of the conventional cleaning solutions. This problem is resolved by using the cleaning composition of the present invention, which effectively cleans a metal substrate without promoting corrosion of the metal substrate because of its weak acidic formulation.

At least one hydroxylammonium compound must be included as a key component in the composition of the present invention. The hydroxylammonium compound, for example, may be a hydroxylammonium salt that has the formula (I):

$$n\,(NR_1R_2R_3OH)^+(X^{-n}) \qquad (I)$$

wherein $R_1$, $R_2$ and $R_3$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R_1$, $R_2$ and $R_3$ are either hydrogen, lower alkyl group or lower alkoxy group, and wherein X is an anionic moiety that forms a water-soluble salt with the hydroxylammonium cations or quaternary ammonium cations, and n is the valence of X and is from 1 to 3. Hydroxylammonium compounds that can be used to form cleaning composition suitable for use with the cleaning method of the invention include hydroxylammonium salts such as hydroxylammonium nitrate (also referred to as HAN), hydroxylammonium sulfate (also referred to as HAS), hydroxylammonium phosphate, hydroxylammoniun chloride, hydroxylammonium oxalate, hydroxylammonium citrate, hydroxylammonium fluoride, N,N-diethyl hydroxylammonium sulfate, N,N-diethylhydroxylammonium nitrate, and the like.

The hydroxylammonium compound is present in the composition of the invention in the range between about 0.01 wt. % to about 30 wt. %. Preferably, there is about 0.1 wt. % to about 20 wt. % of the hydroxylammonium compound in the composition. The amount of hydroxylammonium compound relative to the amount of basic amine and/or quaternary ammonium hydroxide is adjusted such that the pH of the overall composition is maintained within the range between about 2 to about 6, preferably within a range between about 3.0 to about 4.5. The hydroxylammonium compound facilitates the removal of plasma etching residues and inhibits corrosion of the metal substrate.

The present invention includes at least one basic compound. The basic compound may be, for example, an amine or quaternary ammonium hydroxide. Amines that can be used as the basic component of the cleaning composition of the present invention include hydroxylamine and other alkanolamines such as monoethanolamine, diethanolamine, triethanolamine, diethylene-glycolamine, N-hydroxylethylpiperazine, and the like. Quaternary ammonium hydroxides that can be used as the basic component of the cleaning composition of the present invention include tetraalkylammonium hydroxides having methyl, ethyl, propyl, butyl, hydroxyethyl, and the combinations thereof (e.g., tetramethylammonium hydroxide (hereinafter referred to as TMAH), tetraethylammonium hydroxide, trimethyl hydroxyethylammonium hydroxide, methyl tri (hydroxyethyl) ammonium hydroxide, tetra (hydroxyethyl) ammonium hydroxide, benzyl trimethylammonium hydroxide and the like). Additionally, a combination of ammonium hydroxide with one or more quaternary ammonium hydroxides may also be used.

The basic compound is present in the cleaning composition of the invention in the range between about 0.01% to about 3%, by weight. Preferably, there is about 0.05% to about 2%, by weight, of the basic compound in the composition.

At least one organic carboxylic acid must be included in the composition of the present invention. The carboxylic acid serves as a corrosion inhibitor. Carboxylic acids, especially those containing hydroxyl groups, can effectively inhibit metal corrosion of aluminum, copper, and their alloys. The carboxylic acids have a chelating effect on those metals. Suitable carboxylic acids include monocarboxylic and polycarboxylic acids. For example, the carboxylic acid may be, but is not limited to, formic acid, acetic acid, propionic acid, valeric acid, isovaleric acid, oxalic acid, malonic acid, succinic acid, glutaric acid, maleic acid, fumaric acid, phthalic acid, 1,2,3-benzenetricarboxylic acid, glycolic acid, lactic acid, citric acid, salicylic acid, tartaric acid, gluconic acid, and mixtures thereof. The preferred organic carboxylic acids are citric acid and lactic acid.

The organic carboxylic acid is conveniently added in an amount between about 0.01 wt. % to about 10.0 wt. %. Preferably about 0.05 wt. % to about 3.0 wt. %, and most preferably about 0.1 wt. % to about 1.0 wt. % of carboxylic acid is included in the composition.

The cleaning composition of the present invention may, optionally, include a polyhydric compound. The polyhydric compound may be, for example, ethylene glycol, propylene glycol, glycerol, and mixtures thereof.

The present invention may further include additives. Additives such as chelating compounds or surface active agents can enhance the effectiveness of the composition of the present invention in removing particulate and/or metallic contaminants from the wafer surface. Suitable additives are, for example, nonionic surfactants, especially chelating group attached polyoxyethylene type surfactant known as CS-1, which is commercially available from BASF.

In a preferred embodiment of the present invention, the composition for removing plasma etch residues formed on a substrate comprises: water, about 0.2 wt. % to about 20 wt. % hydroxylammonium sulfate, about 0.01 wt. % to about 0.1 wt. % of tetramethylammonium hydroxide, and about 0.1 wt. % to about 3 wt. % citric acid. The pH of the composition of this embodiment is between about 2 to about 6, and preferably about 3 to about 4.

The substrate can be contacted with the cleaning composition by any suitable method, such as by placing the cleaning composition into a tank and submerging the substrates into the cleaning composition. Preferably, the substrates are spray rinsed with the cleaning composition.

The present invention also includes a cleaning method used in combination with the following photoresist stripping processes, which are typically conducted prior to the present cleaning method. Any suitable dry stripping process can be used including $O_2$ plasma ashing, ozone gas phase-treatment, fluorine plasma treatment, hot $H_2$ gas treatment (described in U.S. Pat. No. 5,691,117), and the like. The preferred stripping process is $O_2$ plasma ashing.

In addition, the cleaning method can also be used in combination with a organic wet stripping method. The organic wet strip can be performed either before, after, or both before and after the cleaning method of the present invention. Any conventional organic wet stripping solution can be used and a person skilled in the art would be able to choose the appropriate organic wet stripper. The preferred wet stripping process is treatment with ozonated water in combination with the cleaning composition of the present invention. Thus, the cleaning method of the invention can be used to replace the organic solvent-based post-strip rinse. This is because the preferred cleaning composition is a non-corrosive and neutral to weakly acidic aqueous solution that will not harm the environment. Furthermore, the cleaning compositions used in the present cleaning method may be disposed of in a regular drain system for aqueous chemical wastes.

The method for removing a residue from a substrate, such as copper or aluminum, comprises the step of applying a cleaning composition comprising (a) water, (b) at least one hydroxylammonium compound, (c) at least one basic compound, and (d) at least one organic carboxylic acid, to the substrate. The basic compound is preferably selected from the group consisting of amines and quaternary ammonium hydroxides. In addition, the cleaning composition may also include a polyhydric compound. It is also preferred that the pH of the cleaning composition be about 2 to about 6. More preferably, the pH should be about 3.0 to about 4.5.

To illustrate the present invention, the following examples are provided. It should be understood that the present invention is not limited to the examples described.

EXAMPLE 1

A cleaning solution was prepared by dissolving 21 grams of hydroxylammonium sulfate (HAS) and 1 gram of citric acid (CA) in 9968 gram of DI water and adjusting the pH of the resulting solution in the range of 3.3 to 3.4 by adding 1 gram of 25 wt. % of tetramethylammonium hydroxide (TMAH). The resulting solution has the following concentration of each component; HAS 0.21 wt. %, CA 0.1 wt. %, TMAH 0.01 wt. %, and the balance water.

The test wafer was prepared by deposition of multilayers onto a silicon substrate, followed by plasma etching of the top three layers after micro-patternization of the photoresist film lithographically:

(1) Deposition of $SiO_2$ (bottom layer), Cu, $Si_3N_4$, a low-k dielectric layer (SiLK® supplied by Dow Chemical), $SiO_2$, and photoresist (top layer), where all other layers were deposited by the CVD (chemical vapor deposition) method except for the SiLK and photoresist layers that were spin-coated; and (2) Plasma etching of the upper $SiO_2$ layer was done by using the patternized photoresist film as a mask with a fluorine-containing gas, followed by the second plasma etching of the SiLK layer as well as ashing of the photoresist mask by using an oxygen-containing gas.

The resultant wafer had a chunk of post-etch residue dispersed inside the via hole. The wafer was thereafter treated with the above-described cleaning composition at 55° C. for 15 minutes, followed by a water rinse at room temperature for 5 minutes and then dried by blowing a jet stream of nitrogen gas onto the wafer surface.

The cleaned wafer was cut to see a cross-sectional view of the via hole under a scanning electron microscope (SEM). The SEM inspection showed that the post-etch residue was completely removed from the via hole without any damage to other layers, i.e., SiLK, Cu, $Si_3N_4$, and top $SiO_2$ layers.

EXAMPLE 2

A cleaning solution was prepared by adding 20.5 gram of solid HAS, 3.41 gram of 88 wt. % lactic acid (LA) aqueous solution, and 0.91 gram of 25 wt. % TMAH aqueous solution to DI water (75.18 gram). The resulting solution had the following concentration of each component: HAS 20.5 wt. %, LA 3.0 wt. %, TMAH 0.23 wt. %, and the balance water.

The test wafer was prepared by deposition of multilayers onto a silicon substrate, followed by plasma etching of the top three layers after micro-patternization of the photoresist film lithographically:

(1) Deposition of $SiO_2$ (bottom layer), TiN, Al—Cu alloy (Cu 1%), TiN, and photoresist (top layer), where all other layers were deposited by CVD except that the photoresist layer was spin-coated; and (2) Plasma etching of the Al—Cu layer as well as the upper and lower nitride layers was done by using the patternized photoresist mask with a chlorine-containing gas, followed by ashing the photoresist mask by using an oxygen-containing gas.

The resultant wafer had a metal line of Al—Cu in a dimension of 0.6 micron line width, with attached post-etch residue on the sidewall and top of the metal line. The wafer was treated with the above-described cleaning composition at 60° C. for 30 minutes, followed by a water rinse at room temperature for 5 minutes, then dried by blowing a jet stream of nitrogen gas onto the wafer surface.

The cleaned wafer was cut to see a cross-sectional view of the Al—Cu line under SEM so as to determine a line loss of the Al—Cu metal caused by the treatment. The SEM inspection showed that the post-etch residue was completely removed and the line loss was below 5% of the total line width, which is considered an acceptable level.

EXAMPLE 3 (COMPARATIVE)

A cleaning solution was prepared in the same manner described in Example 1, except that citric acid was not added to the cleaning solution. The same test wafer was used in this test as in Example 1.

SEM inspection showed that the post-etch residue was completely removed from the via hole like Example 1, but the copper layer was significantly corroded compared with the result of Example 1 under the same test condition as applied in Example 1.

EXAMPLE 4 (COMPARATIVE)

A cleaning solution was prepared in the same manner described in Example 2, except that lactic acid was not added to the cleaning solution. The same test wafer was used in this test as in Example 2.

The SEM inspection showed that the post-etch residue was completely removed, similar to Example 2, but the line loss was more than 5% of the total aluminum line width under the same test condition as applied in Example 2.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for cleaning residue from a substrate, which comprises the step of: applying a cleaning composition to said substrate, wherein said composition consists of:
  (a) water;
  (b) at least one hydroxylammonium compound;
  (c) at least one basic compound, and
  (d) at least one organic carboxylic acid selected from the group consisting of: lactic acid, citric acid, formic acid, oxalic acid, acetic acid, propionic acid, valeric acid, isovaleric acid, malonic acid, succinic acid, glutaric acid, maleic acid, fumaric acid, phthalic acid, 1,2,3-benzenetricarboxylic acid, glycolic acid, salicylic acid, tartaric acid, and gluconic acid, wherein said carboxylic acid is present in an amount between about 0.01 wt. % to 10 wt. % based on the total weight of the composition.

2. The method of claim 1, wherein said hydroxylammonium compound is selected from the group consisting of: hydroxylammonium sulfate, hydroxylammonium nitrate, hydroxylammonium phosphate, hydroxylammonium chloride, hydroxylammonium oxalate, hydroxylammonium citrate, hydroxylammonium lactate, and mixtures thereof.

3. The method of claim 1, wherein said hydroxylammonium compound is present in an amount between about 0.01 wt. % to 30 wt. % based on the total weight of said composition.

4. The method of claim 1, wherein said basic compound is selected from the group consisting of amines and quaternary ammonium hydroxides.

5. The method of claim 4, wherein said basic compound is a quaternary ammonium hydroxide selected from the group consisting of: tetramethylammonium hydroxide, tetraethylammonium hydroxide, and mixtures thereof.

6. The method of claim 1, wherein said basic compound is present in an amount between about 0.01 wt. % to 3 wt. % based on the total weight of said composition.

7. The method of claim 1, further comprising a polyhydric compound.

8. The method of claim 7, wherein said polyhydric compound is selected from the group consisting of ethylene glycol, propylene glycol, glycerol, and mixtures thereof.

9. The method of claim 1, wherein said composition has a pH of about 2 to 6.

10. The method of claim 1, wherein said composition has a pH of about 3 to 4.5.

11. The method of claim 1, wherein said substrate is a metal substrate.

* * * * *

UNITED STATES PATENT AND TRADEMARK OFFICE
CERTIFICATE OF CORRECTION

PATENT NO. : 7,402,552 B2  Page 1 of 1
APPLICATION NO. : 11/305794
DATED : July 22, 2008
INVENTOR(S) : Kenji Honda It is certified that error appears in the above-identified patent and that said Letters Patent is hereby corrected as shown below:

Title Page, Column 2
Line 1, delete "Kbayashi et al." insert -- Kobayashi et al. --

Signed and Sealed this

Eleventh Day of November, 2008

JON W. DUDAS
*Director of the United States Patent and Trademark Office*